United States Patent
Kalnitsky et al.

(10) Patent No.: US 6,236,082 B1
(45) Date of Patent: May 22, 2001

(54) FLOATING GATE SEMICONDUCTOR DEVICE WITH REDUCED ERASE VOLTAGE

(75) Inventors: Alexander Kalnitsky, San Francisco; Albert Bergemont, Palo Alto, both of CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/134,480

(22) Filed: Aug. 13, 1998

(51) Int. Cl.$^7$ .................................................. H01L 29/788
(52) U.S. Cl. ........................... 257/315; 257/622; 257/317
(58) Field of Search ................................. 257/317, 315, 257/622; 438/259

(56) References Cited

U.S. PATENT DOCUMENTS

| | | | |
|---|---|---|---|
| 4,222,062 | 9/1980 | Trotter et al. ................. | 357/45 |
| 4,222,063 | 9/1980 | Rodgers ........................ | 357/45 |
| 4,845,538 | * 7/1989 | Hazani .......................... | 257/317 |
| 4,975,384 | * 12/1990 | Baglee .......................... | 438/259 |
| 5,029,130 | 7/1991 | Yeh ................................ | 365/185 |
| 5,242,848 | 9/1993 | Yeh ................................ | 437/43 |
| 5,278,087 | 1/1994 | Jenq .............................. | 437/43 |
| 5,488,244 | * 1/1996 | Quek et al. .................... | 257/315 |
| 5,576,569 | * 11/1996 | Yang et al. .................... | 257/317 |
| 6,051,860 | * 4/2000 | Odanaka et al. .............. | 257/316 |

* cited by examiner

*Primary Examiner*—Mark V. Prenty
(74) *Attorney, Agent, or Firm*—Beyer Weaver & Thomas (57) ABSTRACT

The present invention provides a method for forming a shaped floating gate on an integrated circuit substrate. A trench is etched in a surface of the integrated circuit substrate such that a tip is formed. The tip may be defined by a first sidewall that is approximately perpendicular to the surface of the integrated circuit substrate and a second sidewall that is disposed at an angle to the surface of the integrated circuit substrate. A dielectric layer is then formed over the substrate surface and conforming to the trench. Next, a conductive layer is deposited above the dielectric layer such that it fills the trench. The conductive layer is then etched such that a floating gate is defined. A bottom portion of the floating gate is then contained by the trench. The resulting floating gate and semiconductor device includes a dielectric layer disposed above an integrated circuit substrate surface. The substrate surface defines a trench having a tip that may be defined by a first sidewall and a second sidewall. A conductive layer is formed above the dielectric layer such that it fills the trench and defines a floating gate having a tip contained by the trench. In addition, a diffusion region may be disposed in the integrated circuit substrate such that the tip of the floating gate points into the diffusion region.

11 Claims, 6 Drawing Sheets

FLOATING GATE SEMICONDUCTOR DEVICE WITH REDUCED ERASE VOLTAGE

BACKGROUND OF THE INVENTION

1. Field of the Invention

The present invention relates to forming a shaped floating gate. More particularly, the present invention relates to fabricating a floating gate semiconductor device with reduced erase voltage.

2. Description of the Related Art

A nonvolatile memory device is one that retains its information even when power is removed from the circuit. A metal oxide semiconductor (MOS) transistor is typically used for this purpose. One such structure consists of a MOS transistor with a stacked polysilicon gate structure.

Figure 1:
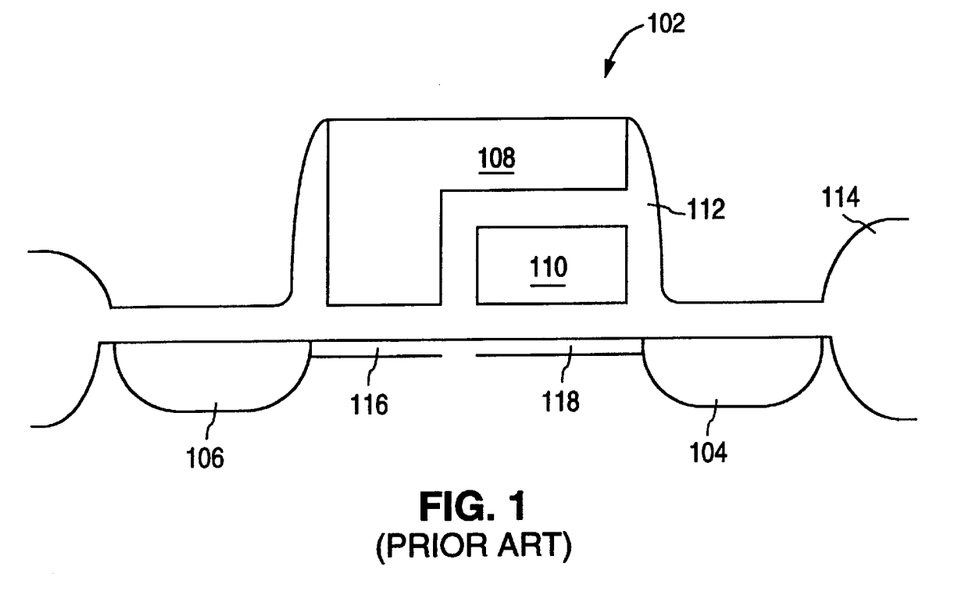
FIG. 1 is a cross-sectional view of a memory cell with a conventional stacked polysilicon gate structure.

Referring to FIG. 1, a cross-sectional view of a memory cell 102 with a conventional stacked polysilicon gate structure is presented. The memory cell 102 includes a source diffusion region 104, a drain diffusion region 106, and a stacked gate structure. The stacked gate structure includes an upper electrode 108 that serves as a control gate and a lower electrode 110 that serves as a floating gate. The memory cell may further include dielectric regions 112. Memory cells are typically separated by a field oxide isolation 114.

To program the memory cell, a positive voltage is applied to the control gate 108. In response to this applied voltage, a first channel 116 is created beneath the control gate 108. If the source 104 is grounded and a voltage is applied to the drain 106, a second channel 118 is created beneath the floating gate 110. Thus, an increased electrical field is created at the junction between the first channel 116 and the second channel 118, and the memory cell 102 is programmed when electrons are injected into the floating gate 110. As shown, the channels 116, 118 formed in such a device are disposed horizontally. As a result, the channel length required for functionality of the device must be realized in the horizontal dimensions of the device.

While such flash EPROM devices can be programmed at reasonably low voltages, erasure of each memory cell is accomplished through Fowler-Nordheim tunneling, and therefore requires high electric fields. This requirement in combination with the minimum thickness of the dielectric required to ensure data retention, translates into high operating voltages. Typically, to erase the memory cell 102, a large negative potential is applied to the control gate 108 with respect to the source 104 diffusion region which may be grounded. Thus, the memory cell 102 is erased when electrons are ejected out of the floating gate 110. However, it would be desirable if a memory cell such as a flash EPROM device could be manufactured with a reduced erase voltage. Such a reduction of the voltage required to erase a memory cell may be accomplished through enhancing the electric field for a given voltage.

Figure 2:
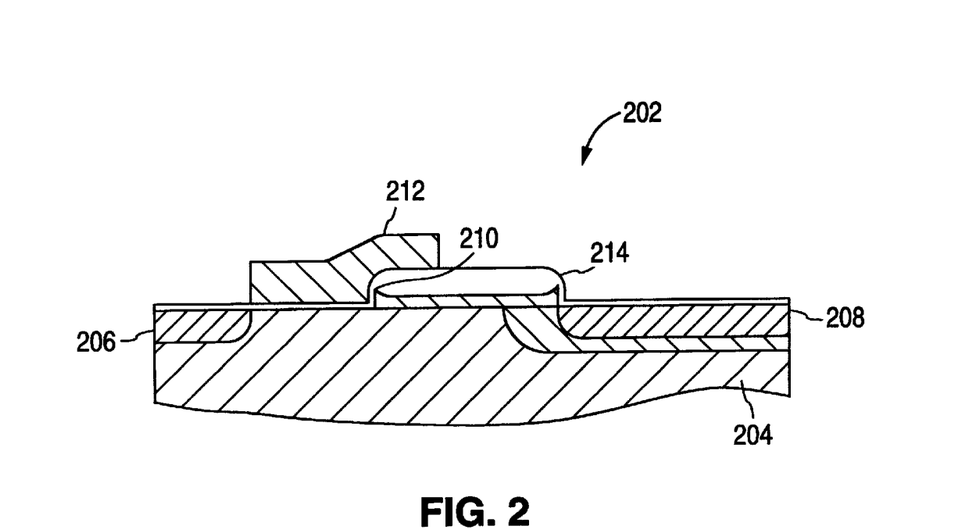
FIG. 2 is a cross-sectional view of a memory cell having a shaped floating gate.

One method for enhancing the electric field for a given voltage and a given tunnel dielectric thickness is to provide an injector shaped in such a way as to locally enhance the electric field. The formation of such a shaped floating gate is disclosed in U.S. Pat. No. 5,029,130 and illustrated generally in FIG. 2. The device 202 is formed on a semiconductor substrate 204 and includes a source diffusion region 206 and a drain diffusion region 208. As shown, the shaped floating gate 210 includes a field-enhancing edge tipped upwards, facing the control gate 212. The floating gate 210 and the control gate 212 are separated by a dielectric layer 214. The method for forming such a structure includes deposition of a floating gate polysilicon. This floating gate polysilicon is then capped with nitride. An aperture is then opened in the nitride. The shape of the floating gate polysilicon is then modified at the edges of the aperture through the formation of a "bird's beak" after a conventional LOCOS (local oxidation) Field Oxidation Process. The nitride and floating gate polysilicon are then etched aligned to the silicon dioxide grown during the LOCOS Field Oxidation Process. However, this disclosed method provides geometrical limitations, since the process requires a minimum nitride opening. Similarly, the oxidation produces a minimum lateral curvature. Accordingly, such a method does not allow for downscaling of a memory cell in sub-micron processes.

In view of the above, a need exists in the prior art for a memory cell with a reduced erase voltage. Moreover, it would be beneficial if a shaped floating gate were fabricated which would allow for downscaling of the cell in sub-micron processes.

SUMMARY OF THE INVENTION

The present invention provides a shaped floating gate. This is accomplished through etching a trench in a surface of an integrated circuit substrate and forming a shaped floating gate that fills the trench. As a result, the shaped floating gate includes a bottom portion that points away from the control gate. Accordingly, the shaped floating gate may be used in a semiconductor device such as a flash EPROM device to enhance the electric field for a given voltage, reducing the voltage required to erase a memory cell.

In accordance with one aspect of the present invention, a method for forming a shaped floating gate on an integrated circuit substrate includes etching a trench in a surface of the integrated circuit substrate. The trench includes a tip that may be defined by a first sidewall and a second sidewall. By way of example, the first sidewall may be approximately perpendicular to the surface of the integrated circuit substrate while the second sidewall may be disposed at an angle to the surface of the integrated circuit substrate. A dielectric layer is formed over the substrate surface and conforming to the trench. A conductive layer is then deposited above the dielectric layer such that it fills the trench. The conductive layer is then etched such that a floating gate is defined. Upon completion of the conductive layer etching step, a bottom portion of the floating gate is contained by the trench. A semiconductor device including the shaped floating gate may then be fabricated.

In accordance with another aspect of the present invention, a semiconductor device includes a diffusion region disposed in an integrated circuit substrate. The substrate surface defines a trench forming a tip that points into the diffusion region. By way of example, the tip may be defined by a first sidewall and a second sidewall. A dielectric layer is disposed above a surface of the integrated circuit substrate surface. A floating gate is formed above the dielectric layer such that the floating gate includes a field enhancing tip contained by the tip of the trench. The dielectric layer forms a dielectric region that is adjacent to the trench and adapted for promoting capacitive coupling between the floating gate and the diffusion region. By way of example, the dielectric region may include a vertically disposed dielectric region adjacent to a first sidewall. As a result, the tip of the floating gate serves as an injector to locally enhance the electric field for a given voltage. Accordingly, the floating gate may be implemented in a memory device such as a flash EPROM to reduce the erase voltage required.

The advantages of the present invention are numerous. Through the placement of a vertically disposed trench region between the shaped floating gate and a high voltage diffusion region, capacitive coupling between the high diffusion region and the floating gate is promoted. Accordingly, the shaped floating gate serves as an injector to enhance the electric field at the tip of the floating gate. Since the electric field is enhanced for a given voltage, the voltage required to erase an EPROM device is reduced. As a result, an integrated circuit containing the present invention consumes minimal power and therefore provides reduced operating costs. Moreover, the shaped floating gate and semiconductor device are scalable, and therefore effective at small geometries to accommodate sub-micron IC feature sizes.

DETAILED DESCRIPTION OF THE PREFERRED EMBODIMENTS

The present invention provides a shaped floating gate and semiconductor device having a shaped floating gate. In one embodiment of the invention, the shaped floating gate is formed such that a tip of the floating gate is contained in an asymmetric V-shaped trench. Through the placement of a vertically disposed trench region between the shaped floating gate and a high diffusion region, capacitive coupling between the high diffusion region and the floating gate is promoted. Accordingly, the shaped floating gate serves as an injector to enhance the electric field at the tip of the floating gate. In this manner, an EPROM device with reduced erase voltage may be manufactured. Moreover, the shaped floating gate and semiconductor device are scalable, and therefore effective at small geometries to accommodate sub-micron IC feature sizes.

Figure 13:
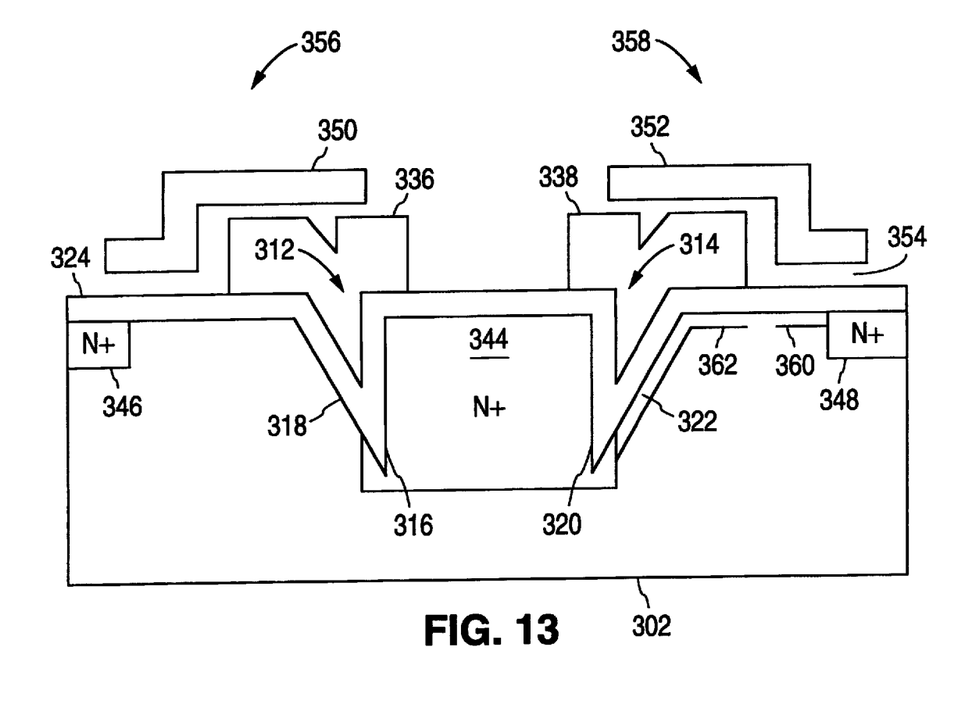
FIG. 13 is a cross-sectional view of the partially fabricated integrated circuit of FIG. 12 after implanting of impurities and control gate formation according to one embodiment of the present invention.

Referring first to FIG. 13, a cross-sectional view of a semiconductor device formed according to one embodiment of the present invention is illustrated. Although two memory cells are shown, any number of memory cells may be simultaneously formed on a substrate 302. A first memory cell 356 may include a first floating gate 336, a first control gate 350, and a first low voltage diffusion region 346. Similarly, a second memory cell 358 may include a second floating gate 338, a second control gate 352, and a second low voltage diffusion region 348. In addition, each of the floating gates 336, 338 is formed above a gate oxide layer 324. In this manner, each pair of memory cells 356, 358 may share a common high voltage diffusion region 344, as shown. By way of example, the common high voltage diffusion region 344 may form a common drain (or source) diffusion region, while the low voltage diffusion regions 346, 348 may form source (or drain) diffusion regions for adjacent memory cells. The first floating gate 336 is formed such that a bottom portion of the first floating gate 336 is contained in a first trench 312 and the second floating gate 338 is formed such that a bottom portion of the second floating gate 338 is contained in a second trench 314. As shown, the first trench 312 includes a first sidewall 316 disposed approximately perpendicular to a surface of the substrate 302 and a second sidewall 318 disposed at an angle to the surface of the substrate 302. Similarly, the second trench 314 includes a first sidewall 320 disposed approximately perpendicular to the surface of the substrate 302 and a second sidewall 322 disposed at an angle to the surface of the substrate 302. Accordingly, an initial step in the fabrication of a semiconductor device such as that illustrated in FIG. 13 is the formation of a desired number of trenches.

Figure 3:
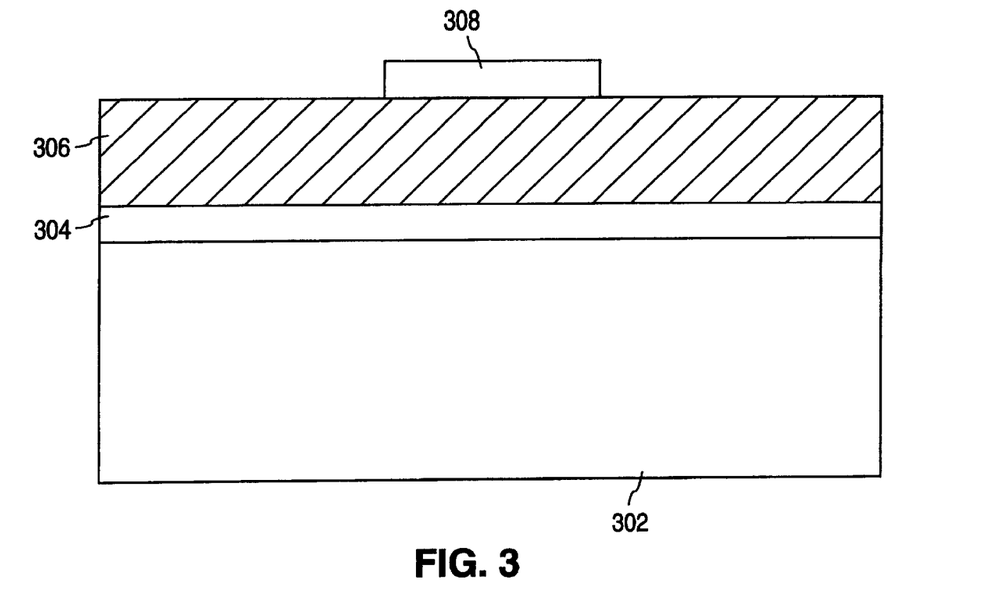
FIG. 3 is a cross-sectional view of a partially fabricated integrated circuit after deposition of a trench mask according to one embodiment of the present invention.

One method for forming the trenches of FIG. 13 includes patterning a sacrificial masked feature in a region defined by a trench mask. FIG. 3 is a cross-sectional view of a partially fabricated integrated circuit undergoing deposition of a trench mask according to one embodiment of the present invention. An integrated circuit substrate 302 having an approximately planar surface is provided. By way of example, the integrated circuit substrate 302 may be a P-type silicon substrate. In addition, an isolation (not shown to simplify illustration) is formed on the substrate by conventional means. By way of example, the isolation may be formed using local oxidation. In order to properly etch trenches in subsequent etching steps, a sacrificial separation layer 304 is then formed on a surface of the integrated circuit substrate. By way of example, the sacrificial separation layer 304 may be made from silicon dioxide and may have a thickness of between approximately 50 Angstroms and approximately 200 Angstroms. Next, a sacrificial feature layer 306 that is to be patterned in subsequent etching steps is deposited above the sacrificial separation layer. By way of example, the sacrificial feature layer may be made from polysilicon and may have a thickness of between approximately 500 Angstroms and approximately 5000 Angstroms. A mask is then patterned to define trench mask 308 on the sacrificial feature layer 306. By way of example, the trench mask 308 may include a photoresist mask patterned according to conventional photolithography to thereby selectively expose regions surrounding the trench mask 308 to a subsequent etching process.

Figure 4:
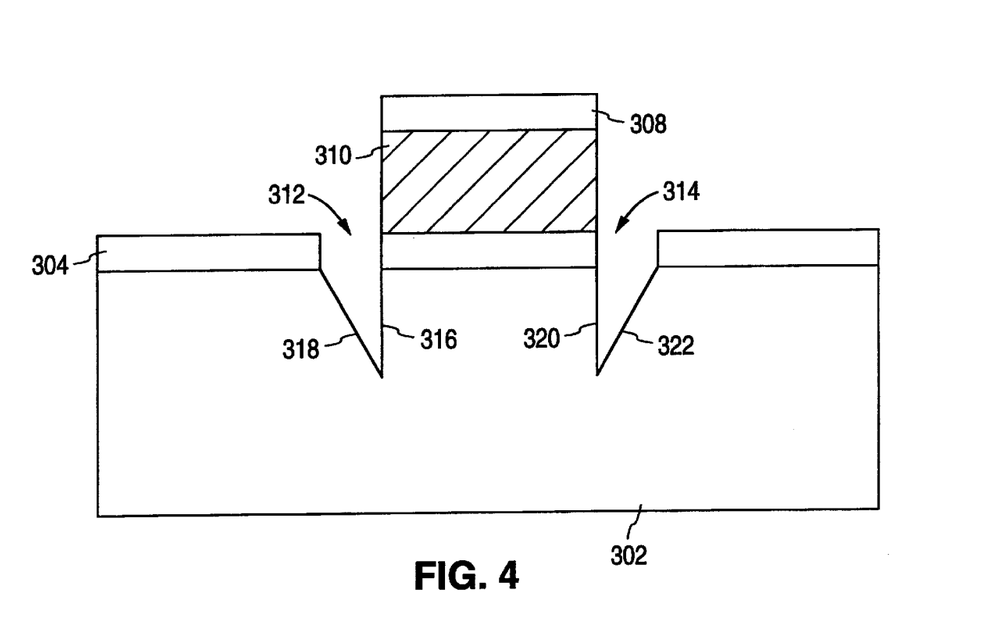
FIG. 4 is a cross-sectional view of the partially fabricated integrated circuit of FIG. 3 after trenching.

Referring next to FIG. 4, a cross-sectional view of the partially fabricated integrated circuit of FIG. 3 after trenching is illustrated. Trenching occurs when the sacrificial feature layer 306 of FIG. 3 is patterned to form a sacrificial masked feature 310 in a region defined by the trench mask 308. As shown, the exposed regions surrounding the trench mask 308 are etched to define one or more trenches. By way of example, the exposed regions may be etched using an isotropic etch. The etching process includes etching the sacrificial feature layer 306 (e.g., polysilicon) highly selective to the sacrificial separation layer 304 (e.g., silicon dioxide). The sacrificial feature layer etch selectivity is defined as the ratio of the etch rate of the sacrificial feature layer 306 to the etch rate of the sacrificial separation layer 304. By way of example, the range of selectivity of the feature etching step may be between approximately 10:1 and approximately 100:1. During creation of the sacrificial masked feature 310, etching is performed to create a parasitic trenching effect in the integrated circuit substrate 302. This parasitic trenching effect is created through increasing the etch rate in close proximity to the sacrificial masked feature 310. As shown, the etch process breaks through the sacrificial separation layer 324 and creates a trench in the substrate 302 on each side of the sacrificial masked feature 310. Since the sacrificial separation layer 304 blocks the selective etch from etching the integrated circuit substrate 302 uniformly, trenches may be formed through patterning the sacrificial masked feature 310. The trenches formed according to this parasitic trenching effect are typically considered undesirable. However, rather than suppressing this effect, each trench may be advantageously used to contain a bottom portion of each floating gate as shown in FIG. 13.

As shown in FIG. 4, a first trench 312 is formed on a side of the sacrificial masked feature 310 opposite that of a second trench 314. The first trench 312 includes a tip defined by a first sidewall 316 and a second sidewall 318. Similarly, the second trench 314 includes a tip defined by a first sidewall 320 and a second sidewall 322. The first sidewalls 316, 320 are approximately perpendicular to the surface of the integrated circuit substrate 302 and adjacent to the sacrificial masked feature 310. In addition, the second sidewalls 318, 322 are disposed at an angle to the surface of the integrated circuit substrate 302. As a result, patterning the masked feature 310 forms two trenches that may be used in two adjacent memory cells. Accordingly, the sacrificial separation layer 304 permits trenches 312, 314 having defined sidewalls to be created as shown. Once all desired trenches are formed, the trench mask 308, the underlying sacrificial masked feature 310, and the sacrificial separation layer 304 may be removed. Moreover, the trenches may be etched to a greater depth during the removal of the sacrificial separation layer 304.

Figure 5:
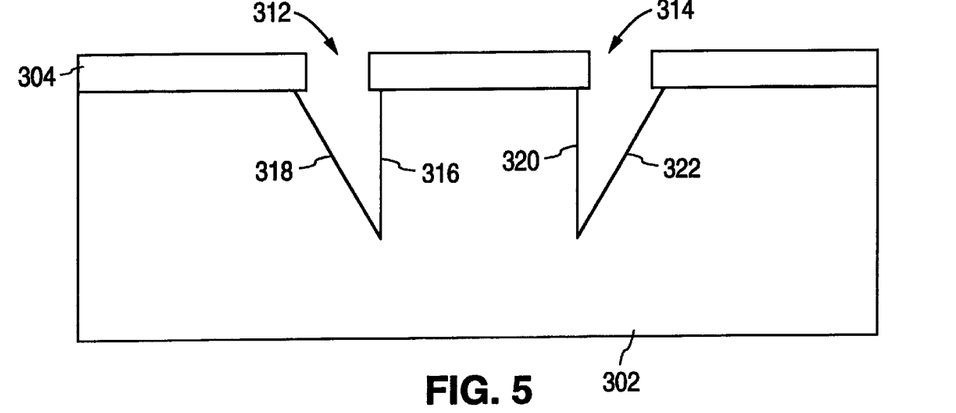
FIG. 5 is a cross-sectional view of the partially fabricated integrated circuit of FIG. 4 after removal of the sacrificial masked feature.

FIG. 5 is a cross-sectional view of the partially fabricated integrated circuit of FIG. 4 after removal of the trench mask 308 and the sacrificial masked feature 310. The trench mask 308 may be removed from the sacrificial masked feature 310 through a selective etch. By way of example, the trench mask 308 may be removed through etching the trench mask 308 (e.g., photo resist) selective to the sacrificial masked feature 310 (e.g., polysilicon). Next, the sacrificial masked feature 310 is removed from the sacrificial separation layer 304 through etching the sacrificial masked feature 310 (e.g., polysilicon) selective to the sacrificial separation layer 304 (e.g., silicon dioxide). By way of example, the sacrificial masked feature 310 may be etched using a conventional etch technique such as a dry or wet etch. Thus, the sacrificial separation layer 304 separates the sacrificial masked feature 310 from the integrated circuit substrate 302, permitting the removal of the sacrificial masked feature 310 from the integrated circuit substrate 302. Moreover, upon removal of the masked feature 310, the depths of the trenches 312 and 314 are increased. In other words, the angles at which the second sidewalls 318, 322 are disposed to the surface of the integrated substrate surface 302 may be increased. Similarly, the length of the sidewalls, 316, 318, 320, 322 may be increased. Accordingly, trenches of a desired depth may be created through selection of an appropriate thickness of the sacrificial masked feature 310 as well as the etching process used. By way of example, each of the trenches 312, 314 should not exceed 0.25 microns for quarter micron technology.

Figure 6:
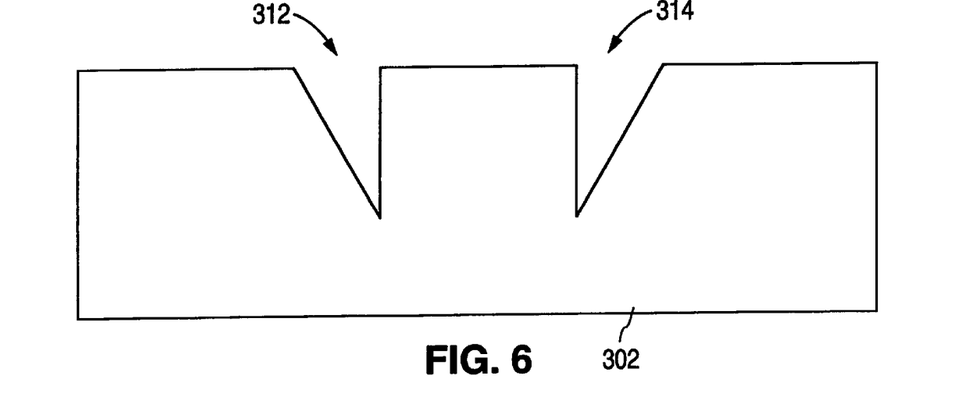
FIG. 6 is a cross-sectional view of the partially fabricated integrated circuit of FIG. 5 after removal of the sacrificial separation layer from the integrated circuit substrate surface.

Referring next to FIG. 6, a cross-sectional view of the partially fabricated integrated circuit of FIG. 5 after removal of the sacrificial separation layer from the integrated circuit substrate surface is illustrated. The sacrificial separation layer may be etched according to conventional etching techniques. Thus, the sacrificial separation layer may be etched selective to the integrated circuit substrate to yield a substantially planar integrated substrate surface having trenches 312, 314 as shown. Upon completion of the sacrificial separation layer etch step, a gate oxide layer, a floating gate and corresponding memory cell may be fabricated above each trench.

Figure 7:
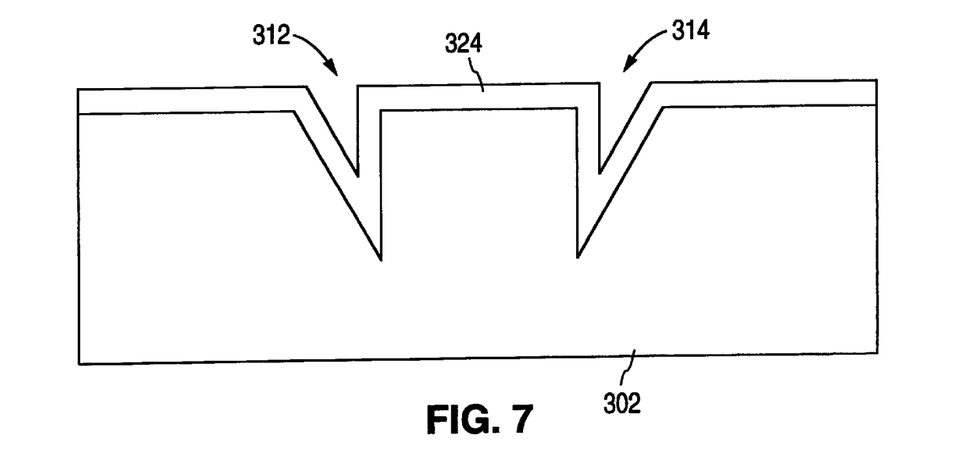
FIG. 7 is a cross-sectional view of the partially fabricated integrated circuit of FIG. 6 after formation of a gate oxide layer.

In order to provide a MOS structure, a gate oxide layer is formed above each trench, thereby providing proper capacitive coupling between each floating gate and corresponding diffusion region (e.g., high voltage diffusion region). FIG. 7 is a cross-sectional view of the partially fabricated integrated circuit of FIG. 6 after formation of a gate oxide layer. As shown, a dielectric "gate oxide" layer 324 is formed above the integrated substrate surface 302 such that it conforms to the trenches 12, 314. By way of example, the gate oxide layer 324 may have a thickness of between approximately 90 and approximately 500 Angstroms. A conductive layer may hen be deposited and patterned to form each floating gate.

Figure 8:
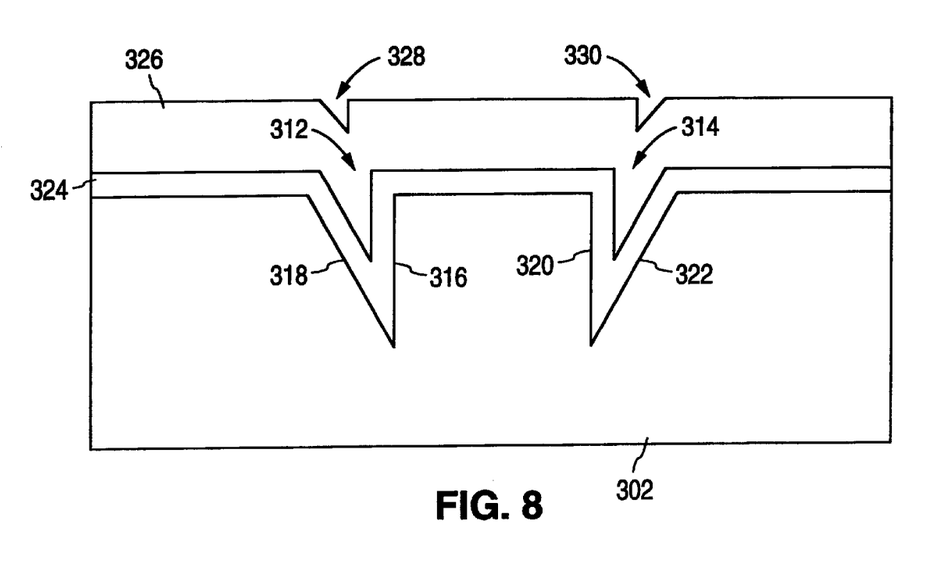
FIG. 8 is a cross-sectional view of the partially fabricated integrated circuit of FIG. 7 after deposition of a conductive layer.

Referring next to FIG. 8, a cross-sectional view of the partially fabricated integrated circuit of FIG. 7 after deposition of a conductive layer is illustrated. As shown, a polysilicon conductive layer 326 is deposited above the dielectric gate oxide layer 324 such that it fills the trenches 312, 314, forming a sharp polysilicon tip in each trench. As a result, folds 328, 329 may be incidentally formed above the conductive layer 326 due to the underlying trenches 312, 314. The conductive layer may be made from polysilicon and may be doped to increase the conductivity of the floating gates that are subsequently formed from the conductive layer 326.

Figure 9:
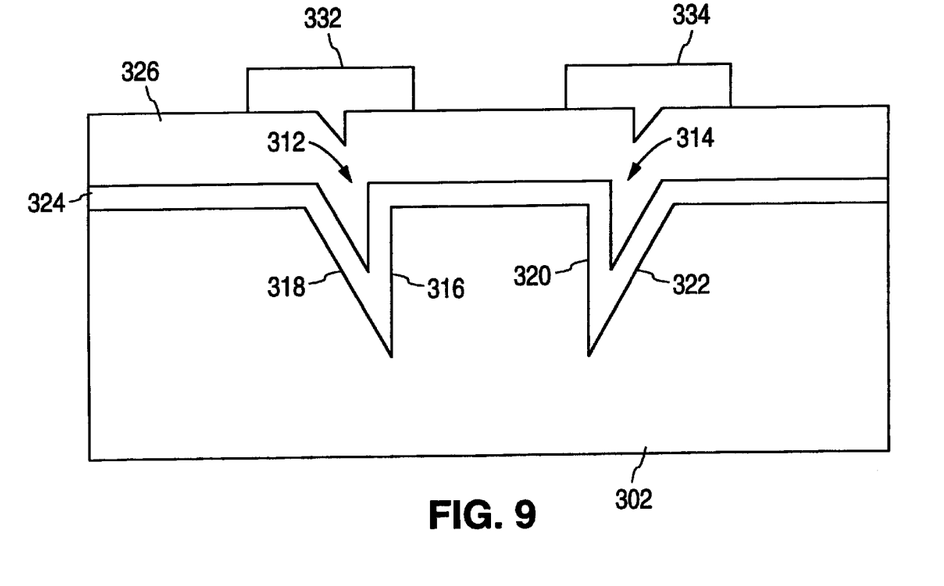
FIG. 9 is a cross-sectional view of the partially fabricated integrated circuit of FIG. 8 after deposition of a floating gate mask.

Referring next to FIG. 9, a cross-sectional view of the partially fabricated integrated circuit of FIG. 8 after deposition of a floating gate mask is illustrated. As shown, floating gate masks 332, 334 are patterned and placed above the conductive layer 326 such that they overlap the trenches 312, 314. The floating gate masks 332, 334 may be patterned according to conventional photolithography on a photo resist layer, an oxide layer, or a nitride layer. In addition, the floating gate masks 332, 334 overlap the isolation (not shown to simplify illustration) to limit conduction of a parasitic transistor that occurs between two neighboring transistors.

Figure 10:
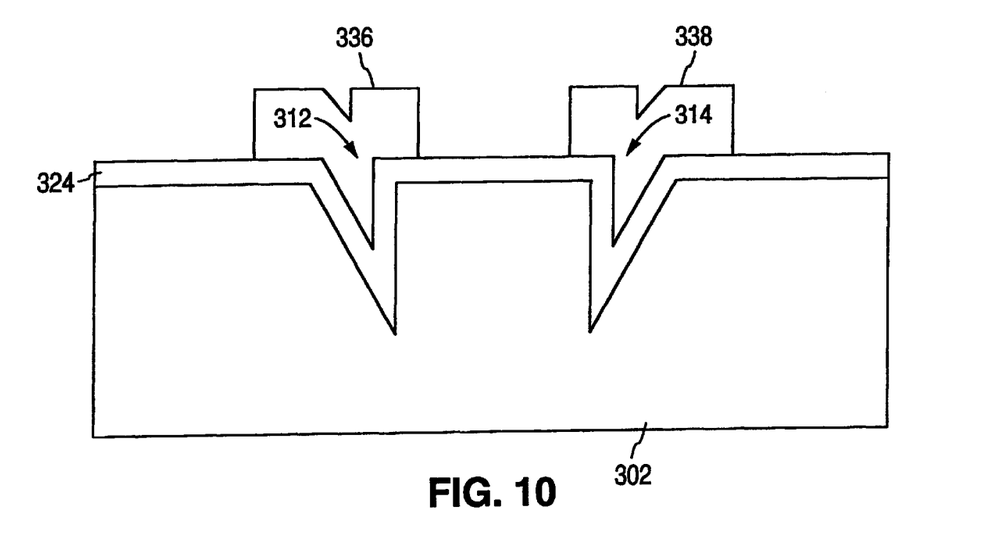
FIG. 10 is a cross-sectional view of the partially fabricated integrated circuit of FIG. 9 after etching of the conductive layer.

FIG. 10 illustrates a cross-sectional view of the partially fabricated integrated circuit of FIG. 9 after etching of the conductive layer in regions defined by the floating gate masks shown in FIG. 9. The conductive layer 326 shown in FIG. 10 is etched such that a floating gate is defined by the corresponding floating gate mask. Thus, a first floating gate 336 and a second floating gate 338 may be simultaneously defined. As shown, a bottom portion of the first floating gate 336 is contained by the first trench 312 and a bottom portion of the second floating gate 338 is contained by the second trench 314. Accordingly, the floating gates 336, 338 each may form a sharp tip contained by the trenches 312, 314. Each floating gate and corresponding memory cell may be fabricated such that a contact may be positioned adjacent to either side of the floating gate. By way of example, the distance between the two floating gates 336, 338 may be sufficiently large to accommodate a contact. Therefore, the desired size of this contact hole may dictate the minimum size of the sacrificial masked feature 310 shown in FIG. 4.

Figure 11:
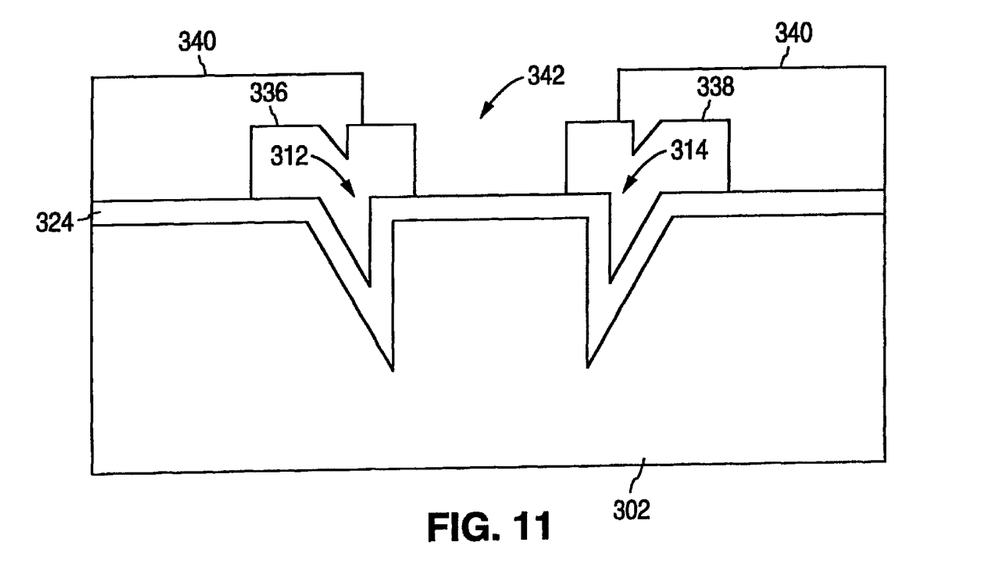
FIG. 11 is a cross-sectional view of the partially fabricated integrated circuit of FIG. 10 after application of a high voltage diffusion mask.

Referring next to FIG. 11, a cross-sectional view of the partially fabricated integrated circuit of FIG. 10 after application of a high voltage diffusion mask is illustrated. High voltage diffusion mask 340 is formed over the integrated circuit substrate 302 and may be aligned to the edges of the floating gates 336, 338 to define a high voltage diffusion region 342 in which impurities are to be implanted. The high voltage diffusion mask 340 may be formed according to conventional photolithography.

Figure 12:
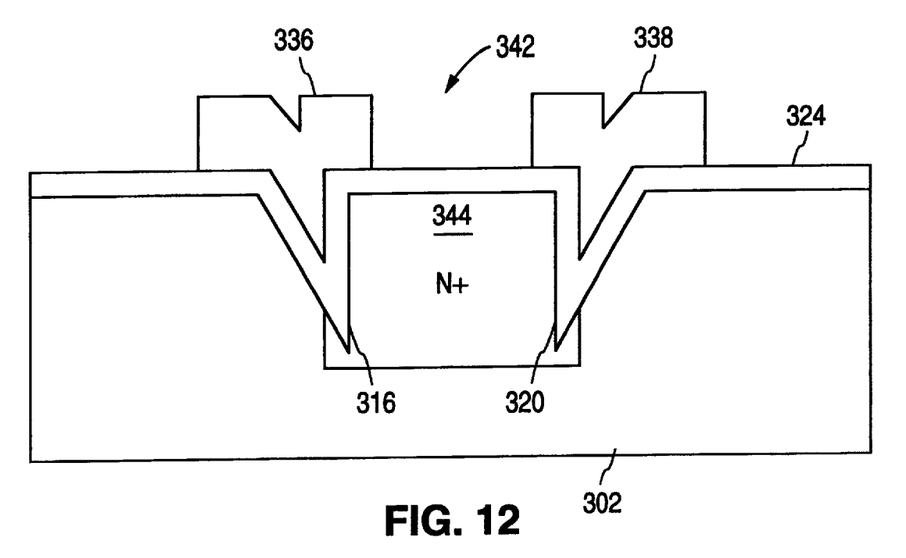
FIG. 12 is a cross-sectional view of the partially fabricated integrated circuit of FIG. 11 after implanting of impurities.

FIG. 12 illustrates a cross-sectional view of the partially fabricated integrated circuit of FIG. 11 after implanting of impurities. Impurities are implanted in the high voltage diffusion region 342 to form a high voltage diffusion region 344 in the substrate. The high voltage diffusion region 344 is disposed adjacent to the first sidewall 316 of the trench of an associated memory cell. As shown, the high voltage diffusion region 344 may be a common high voltage diffusion region shared by two memory cells. Accordingly, the common high voltage diffusion region 344 is bounded on a first side by the first sidewall 316 of the first trench and on a second side by the first sidewall 320 of the second trench. The high voltage diffusion mask (not shown) is then removed. The common high voltage diffusion region 344 preferably extends below the tip of the trenches 312, 314 to couple sufficient voltage to the tip of each floating gate 336, 338, therefore minimizing the voltage required to erase the corresponding memory cell. In addition, extending the common high voltage diffusion region 344 below the tip of the trenches 312, 314 reduces the channel length and corresponding erase voltage. As a result, each floating gate 336, 338 may include a sharp field-enhancing tip that faces downward into the high voltage diffusion, facilitating the erase operation. Although illustrated separately, this high voltage diffusion implant may be performed in combination with other process steps, such as the formation of the split gate dielectric.

As shown in FIG. 12, the dielectric layer 324 forms a first vertically disposed region adjacent to the first sidewall 316 of the first trench 312 and a second vertically disposed region adjacent to the first sidewall 320 of the second trench 314. The first vertically disposed region promotes capacitive coupling between the common high voltage diffusion region 344 and the first floating gate 336. Similarly, the second vertically disposed region promotes capacitive coupling between the common high voltage diffusion region 344 and the second floating gate 338.

FIG. 13 illustrates a cross-sectional view of the partially fabricated integrated circuit of FIG. 12 after implanting of impurities and control gate formation. The first control gate 350 is formed such that a portion of the first control gate 350 extends over the first floating gate 336. Similarly, the second control gate 352 is formed such that a portion of the second control gate 352 extends over the second floating gate 338. The control gates 350, 352 and the floating gates 336, 338 are separated by an interpolysilicon dielectric layer 354. Adjacent transistors are then masked to yield an exposed memory cell. A low voltage diffusion implant is then performed to form a low voltage diffusion region for each memory cell and to further dope each exposed memory cell. Thus, the first low voltage diffusion region 346 is disposed in the substrate 302 opposite the second sidewall 318 of the first trench 312 and the second low voltage diffusion region 348 is disposed in the substrate 302 opposite the second sidewall 322 of the second trench 314. Accordingly, a pair of memory cells that share a common high voltage diffusion region may be simultaneously formed. In this manner, a flash EPROM device having a reduced erase voltage may be fabricated.

Each fabricated memory cell in the flash EPROM device may be programmed or erased accordingly. By way of example, to program the second memory cell 358, a low voltage is placed on first control gate 350 and a high voltage is placed on the second low voltage diffusion region 348 with respect to the common high voltage diffusion region 344. This produces a charge on the second floating gate 338, programming the second memory cell. The second memory cell 358 may then be read or written to as necessary.

To erase selected memory cells in the flash EPROM device or to operate in flash mode, a negative voltage is placed on the control gate of the memory cell with respect to the common high voltage diffusion region 344. By way of example, a negative voltage may be placed on the second control gate 352 to erase the second memory cell 358 while the common high voltage diffusion region 344 is connected to a constant voltage potential (e.g., grounded). A control gate channel 360 is created beneath the second control gate 352 and a floating gate channel 362 is created beneath the second floating gate 338. Capacitive coupling between the second control gate 352 and the second floating gate 338 therefore creates an enhanced field at the tip of the second floating gate 338, forcing electrons out of the second floating gate 338.

In addition, a section of memory cells in the flash EPROM device may be simultaneously erased through the application of a positive voltage to the common high voltage diffusion region 344 while the control gates 350, 352 and the low voltage diffusion regions 346, 348 are connected to a constant voltage potential (e.g., grounded). In this manner, the first 356 and second 358 memory cells may be simultaneously erased.

The shaped floating gate permits the channel length required for the functionality of a semiconductor device to be maximized while minimizing the horizontal dimensions of the device. By way of example, the length of the floating gate channel 362 is determined by the width of the floating gate mask (not shown) as well as the length of the second sidewall 322 of the second trench. As a result, the floating gate channel 362 is created at an angle to the surface of the integrated circuit substrate 302. Accordingly, the horizontal surface area required to produce adequate channels 360, 362 in a functional semiconductor device is minimized.

Through the use of a shaped floating gate having a pointed tip, the horizontal surface area of the semiconductor device is minimized. As a result, the channel length required for functionality of the semiconductor device is maximized while yielding a scalable memory cell. In the embodiment shown, the floating gate provides a sharp tip that serves as an injector, enhancing the electric field for a given voltage and a given tunnel dielectric thickness. By way of example, a conventional flash EPROM device may require between approximately 12 and approximately 15 volts to erase a memory cell. Through the use of the embodiment shown, an erase voltage of between approximately 7 and approximately 10 volts may be applied. Accordingly, the improved floating gate provides a reduced erase voltage when implemented in a semiconductor device such as a flash EPROM device. As a result, an integrated circuit containing the present invention consumes minimal power and therefore provides reduced operating costs.

Although illustrative embodiments and applications of this invention are shown and described herein, many variations and modifications are possible which remain within the concept, scope, and spirit of the invention, and these variations would become clear to those of ordinary skill in the art after perusal of this application. For instance, the present invention is described as providing a flash EPROM device. However, it should be understood that the invention is not limited to devices of this type, but instead would equally apply regardless of the type of device used. Also, for the shaped floating gate described, the floating gate is shown having a sharp tip formed by two sidewalls. This is not a requirement of the invention and therefore, other modifications to the floating gate would still fall within the scope of the invention. By way of example, the floating gate may include any vertically disposed portion having a tip that points away from the control gates or into the high voltage diffusion region. As yet another example, the tip may be formed such that one or both of the sidewalls are non-linear or have varying dimensions. Thus, although the dielectric layer is described as forming a vertically disposed dielectric region, this dielectric region may be formed in an alternate manner consistent with the shape of the floating gate to promote capacitive coupling between the drain diffusion region and the tip of the floating gate. Accordingly, the present embodiments are to be considered as illustrative and not restrictive, and the invention is not to be limited to the details given herein, but may be modified within the scope and equivalents of the appended claims.

What is claimed is:

1. A shaped floating gate formed on an integrated circuit substrate, comprising:
   a dielectric layer disposed above a surface of the integrated circuit substrate, the substrate surface defining a trench, the trench having a tip defined by a first sidewall and a second sidewall, the first sidewall being approximately perpendicular to the surface of the integrated circuit substrate and the second sidewall being disposed at an angle to the surface of the integrated circuit substrate; and
   a conductive layer formed above the dielectric layer such that it fills the trench, the conductive layer defining a floating gate having a bottom portion contained by the trench.

2. An electrically programmable and erasable memory device formed on an integrated circuit substrate, comprising:
   a first dielectric layer disposed above a surface of the integrated circuit substrate, the substrate surface defining a trench, the trench having a tip defined by a first sidewall and a second sidewall, the first sidewall being approximately perpendicular to the surface of the integrated circuit substrate, and the second sidewall being disposed at an angle to the surface of the integrated circuit substrate;
   a high voltage diffusion region being disposed in the substrate adjacent to the first sidewall of the trench;
   a floating gate formed above the first dielectric layer and filling the trench such that the floating gate includes a sharp tip contained by the trench;
   a low voltage diffusion region disposed in the substrate opposite the second sidewall of the trench;
   a second dielectric layer formed above the substrate and the floating gate; and
   a control gate formed above the second dielectric layer such that the control gate extends over a portion of the floating gate.

3. The electrically programmable and erasable memory device as recited in claim 2, wherein the first dielectric layer forms a vertically disposed region adjacent to the first sidewall of the trench, the vertically disposed region being adapted for promoting capacitive coupling between the high voltage diffusion region and the floating gate.

4. The electrically programmable and erasable memory device as recited in claim 2, wherein the high voltage diffusion region extends below the tip of the trench.

5. The electrically programmable and erasable memory device as recited in claim 2, wherein the sharp tip of the floating gate points downward into the high voltage diffusion region.

6. The electrically programmable and erasable memory device as recited in claim 2, wherein the sharp tip of the floating gate points away from the control gate.

7. An electrically programmable and erasable memory device formed on an integrated circuit substrate, comprising:
   a pair of floating gates, each of the pair of floating gates as recited in claim 1, the pair of floating gates including a first floating gate formed above a first trench and a second floating gate formed above a second trench, wherein the bottom portion of each floating gate forms a sharp tip, the first sidewalls being separated by a region that is adapted for accommodating an electrical contact.

8. The electrically programmable and erasable memory device as recited in claim 7, further including a common high voltage diffusion region bounded on a first side by the first sidewall of the first trench and on a second side by the first sidewall of the second trench, wherein the first dielectric layer forms a first vertically disposed region adjacent to the first sidewall of the first trench and a second vertically disposed region adjacent to the first sidewall of the second trench, the first vertically disposed region being adapted for promoting capacitive coupling between the common high voltage diffusion region and the first floating gate, and the second vertically disposed region being adapted for promoting capacitive coupling between the common high voltage diffusion region and the second floating gate.

9. The electrically programmable and erasable memory device as recited in claim 7, further including:
   a first low voltage diffusion region and a second low voltage diffusion region, the first low voltage diffusion region being disposed in the substrate opposite the second sidewall of the first trench and the second low voltage diffusion region being disposed in the substrate opposite the second sidewall of the second trench;
   a second dielectric layer formed above the substrate and each one of the floating gates;
   a first control gate formed above the second dielectric layer such that a portion of the first control gate overlaps the first floating gate; and
   a second control gate formed above the second dielectric layer such that a portion of the second control gate overlaps the second floating gate.

10. The electrically programmable and erasable memory device as recited in claim 8, wherein the sharp tip of each of the floating gates points into the common high voltage diffusion region.

11. The electrically programmable and erasable memory device as recited in claim 9, wherein the sharp tip of each of the floating gates points away from the control gates.

* * * * *